(12) United States Patent
Kamijima

(10) Patent No.: US 6,537,732 B2
(45) Date of Patent: Mar. 25, 2003

(54) RESIST PATTERN AND METHOD OF FORMING SAME, METHOD OF FORMING THIN-FILM PATTERN, AND METHOD OF MANUFACTURING MICRO DEVICE

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 45 days.

(21) Appl. No.: 09/770,195

(22) Filed: Jan. 29, 2001

(65) Prior Publication Data

US 2001/0010885 A1 Aug. 2, 2001

(30) Foreign Application Priority Data

Feb. 2, 2000 (JP) ........................................ 2000-025696

(51) Int. Cl.$^7$ .............................. G03F 7/00; G03F 7/09; H01L 41/00; H04R 15/00
(52) U.S. Cl. ....................... 430/311; 430/313; 430/322; 430/323; 430/324; 438/3
(58) Field of Search .................. 430/312, 313, 430/314, 394; 216/12, 47; 438/3

(56) References Cited

U.S. PATENT DOCUMENTS 5,804,083 A * 9/1998 Ishii et al. ..................... 216/2
6,187,513 B1 * 2/2001 Katakura ..................... 430/312
6,217,783 B1 * 4/2001 Goenka et al. ............. 430/313
6,303,416 B1 * 10/2001 Bruce et al. ................. 438/166

FOREIGN PATENT DOCUMENTS

| JP | B2 7-6058 | 1/1995 |
|---|---|---|
| JP | A 9-96909 | 4/1997 |
| JP | A 09-282617 | 10/1997 |
| JP | A 11-345406 | 12/1999 |

* cited by examiner

Primary Examiner—Mark F. Huff
Assistant Examiner—Kripa Sagar
(74) Attorney, Agent, or Firm—Oliff, Berridge, PLC

(57) ABSTRACT

A resist pattern includes: an upper layer pattern made of a resist; and a lower layer pattern made of a material being soluble in a developer used for forming the upper layer pattern. The upper layer pattern extends over a portion corresponding to a thin-film pattern to be formed and other portions while the lower layer pattern is formed only in the other portions. The lower layer pattern may be made of polymethylglutarimide with or without a dye. The thin-film pattern is formed through any of an etching method, a liftoff method, and a method utilizing both etching and liftoff methods.

7 Claims, 20 Drawing Sheets

RESIST PATTERN AND METHOD OF FORMING SAME, METHOD OF FORMING THIN-FILM PATTERN, AND METHOD OF MANUFACTURING MICRO DEVICE

BACKGROUND OF THE INVENTION

1. Field of the Invention

The present invention relates to a resist pattern and a method of forming the same, a method of forming a thin-film pattern through the use of the resist pattern, and a method of manufacturing a micro device.

2. Description of the Related Art

As disclosed in Published Unexamined Japanese Patent Application (KOKAI) Heisei 9-96909 (1997), for example, methods such as etching, liftoff, or a combination of etching and liftoff (hereinafter called a combination method) have been employed to form a thin-film pattern on a substrate through the use of a resist pattern. These methods will now be described.

FIG. 36A to FIG. 36D illustrate the etching method. In this method, as shown in FIG. 36A, a film 202 to be patterned is formed on a substrate 201. Next, as shown in FIG. 36B, a resist layer is formed on the film 202 and patterned to form a resist pattern 203. Next, as shown in FIG. 36C, the film 202 is selectively etched through dry etching such as ion milling with the resist pattern 203 as a mask. A thin-film pattern 204 having a desired shape is thus obtained. Next, as shown in FIG. 36D, the resist pattern 203 is removed.

FIG. 37A to FIG. 37C illustrate the liftoff method. In this method, as shown in FIG. 37A, a resist layer is formed on a substrate 211 and patterned to form a resist pattern 212. Next, as shown in FIG. 37B, a film 213 to be patterned is formed over the entire surface on top of the substrate 211 and the resist pattern 212. Next, as shown in FIG. 37C, the resist pattern 212 is lifted off. A thin-film pattern 214 having a desired shape is thus obtained.

FIG. 38A to FIG. 38E illustrate the combination method. In this method, as shown in FIG. 38A, a first film 222 to be patterned is formed on a substrate 221. Next, as shown in FIG. 38B, a resist layer is formed on the first film 222 and patterned to form a resist pattern 223. Next, as shown in FIG. 38C, the first film 222 is selectively etched through dry etching such as ion milling with the resist pattern 223 as a mask. A first thin-film pattern 224 having a desired shape is thus obtained. Next, as shown in FIG. 38D, a second film 225 to be patterned is formed over the entire surface on top of the substrate 221 and the resist pattern 223. Next, as shown in FIG. 38E, the resist pattern 223 is removed. A second thin-film pattern 226 having a desired shape is thus obtained. Through this combination method, the first thin-film pattern 224 and the second thin-film pattern 226 contiguous with each other are formed on the substrate 221.

It is preferred to utilize a resist pattern having a T-shaped cross section for the foregoing methods. One of the methods for making such a resist pattern is the method utilizing a two-layer resist as disclosed in Published Examined Japanese Patent Application (KOKOKU) Heisei 7-6058 (1995), for example. The two-layer resist is a material including an upper layer made of a resist, and a lower layer made of a material being soluble in a developer used for the upper layer.

Reference is now made to FIG. 39A to FIG. 39D to describe the method of forming a resist pattern having a T-shaped cross section through the use of a two-layer resist. In this method, as shown in FIG. 39A, a lower layer 232 of the two-layer resist is formed on a substrate 231. The lower layer 232 is made of polymethylglutarimide as disclosed in Published Examined Japanese Patent Application (KOKOKU) Heisei 7-6058. Next, as shown in FIG. 39B, an upper layer 233 of the two-layer resist is formed on the lower layer 232. The upper layer 233 is made of a resist such as a photoresist. Next, as shown in FIG. 39C, the layers are exposed to ultraviolet rays, for example, through a mask 234. Next, as shown in FIG. 39D, the upper layer 233 is developed to form a resist pattern made up of an upper layer pattern 236 made of the remainder of the upper layer 233 and a lower layer pattern 235 made of the remainder of the lower layer 232. When developed, part of the lower layer 232 is dissolved. As a result, after the development, a resist pattern thus obtained has a T-shaped cross section in which the lower layer pattern 235 has a width smaller than that of the upper layer pattern 236.

The following problems have been found in the method of forming a thin-film pattern through the use of a resist pattern having a T-shaped cross section. Although the following description illustrates an example in which the two-layer resist pattern made up of the lower layer pattern 235 and the upper layer pattern 236, the same problems apply to the case in which a single-layer resist pattern is utilized.

Reference is now made to FIG. 40 to describe a problem of the etching method. FIG. 40 illustrates the way in which the film 202 formed on the substrate 201 is etched through ion milling, for example, with the two-layer resist pattern made up of the lower layer pattern 235 and the upper layer pattern 236 as a mask. During this etching, the substance making up the film 202 being etched may deposit on sidewalls of the patterns 235 and 236 and thereby form a deposition film 241. If such a deposition film 241 is formed, the deposition layer 241 may cause burrs around the thin-film pattern after the two-layer resist pattern is removed. Defects in the thin-film pattern may thereby result, which reduces the yield of micro devices including such thin-film patterns. The micro devices mean small-size devices fabricated through the use of thin-film forming techniques. Such micro devices include semiconductor devices, thin-film magnetic heads, and transducers and actuators incorporating thin films.

Reference is now made to FIG. 41 to describe a problem of the liftoff method. FIG. 41 illustrates the way in which the film 213 is formed over the entire surface on top of the substrate 211 and the two-layer resist pattern made up of the lower layer pattern 235 and the upper layer pattern 236. During the formation of the film 213, the substance making up the film 213 may deposit on sidewalls of the lower layer pattern 235, too, and burrs 242 may be formed around the thin-film pattern. Defects in the thin-film pattern may thereby result, which reduces the yield of micro devices including such thin-film patterns.

The combination method has both of the problems of the etching method and the liftoff method.

As thus described, the prior-art methods of forming a thin-film pattern through the use of a resist pattern having a T-shaped cross section have problems that cause defects in the thin-film pattern.

A method of forming an electrode layer is disclosed in Published Unexamined Japanese Patent Application (KOKAI) Heisei 9-282617 (1997). This method employs the liftoff method using a bridge-shaped photoresist pattern made up of a single-layer photoresist. This method using the bridge-shaped photoresist pattern is capable of avoiding the problem of the foregoing method utilizing a resist pattern having a T-shaped cross section.

With regard to a thin-film magnetic head incorporating a reproducing (read) head utilizing a magnetoresistive (MR) element, for example, it is required to precisely control the width of the portion that defines the track width of the MR element, and the amount of overhanging of the lead pattern that hangs over the MR element. Therefore, if the MR element and the lead pattern are formed through the combination method using a bridge-shaped resist pattern, it is required to control the cross-sectional shape or length of the portion of the bridge-shaped resist pattern that is located up above the film to be patterned or the base layer, and the height of this portion from the film to be patterned or the base layer, in particular, to obtain desired dimensions.

However, as disclosed in Published Unexamined Japanese Patent Application (KOKAI) Heisei 9-282617, if the bridge-shaped resist pattern is made of a single-layer photoresist, it is difficult to control the cross-sectional shape or length of the portion of the bridge-shaped resist pattern that is located up above the film to be patterned or the base layer, and the height of this portion from the film to be patterned or the base layer, in particular, to obtain desired dimensions. It is therefore difficult to form a thin-film pattern with precision.

In Published Unexamined Japanese Patent Application (KOKAI) Heisei 11-345406 (1999), a method of forming a mask pattern having a bridge-shaped portion is disclosed. This method comprises: a first coating step of applying a first resist to a surface on which the mask pattern is to be formed; a first exposure step of exposing the first resist to form a latent image of specific pattern; a second coating step of applying a second resist to the top of the first resist; a second exposure step of exposing the second resist to form a latent image of specific pattern; a first developing step of developing the second resist to form an upper layer mask pattern; and a second developing step of developing the first resist to form a lower layer mask pattern. The upper layer mask pattern has a bridge-shaped resist portion extending above a portion of the lower layer mask pattern, where the first resist is removed, in the portion where the second resist remains. There is a space between the bridge-shaped resist portion and the surface on which the mask pattern is formed.

However, this method requires the two exposure steps and the two developing steps. Therefore, the problem of this method is that a great number of steps are required.

OBJECT AND SUMMARY OF THE INVENTION

It is an object of the invention to provide a resist pattern and a method of forming the same, a method of forming a thin-film pattern, and a method of manufacturing a micro device for forming a fine thin-film pattern with accuracy without creating defects.

A first resist pattern of the invention is used for forming a thin-film pattern and includes: an upper layer pattern made of a resist; and a lower layer pattern located between the upper layer pattern and a base layer and made of a material being soluble in a developer used for making the upper layer pattern. The upper layer pattern extends over a portion corresponding to the thin-film pattern to be formed and other portions. The lower layer pattern is located only in the other portions.

A first method of forming a resist pattern of the invention is provided for forming the resist pattern to be used for forming a thin-film pattern. The resist pattern includes: an upper layer pattern made of a resist; and a lower layer pattern located between the upper layer pattern and a base layer and made of a material being soluble in a developer used for making the upper layer pattern. The method comprises the steps of: forming a first layer to be the lower layer pattern on the base layer; forming a second layer to be the upper layer pattern on the first layer; exposing the second layer to a specific pattern image; and forming the upper layer pattern extending over a portion corresponding to the thin-film pattern to be formed and other portions and the lower layer pattern located only in the other portions by developing the second layer, which has been exposed, and dissolving part of the first layer using the developer.

A first method of forming a thin-film pattern of the invention is provided for forming the thin-film pattern through the use of a resist pattern. The method comprises the steps of: forming a film to be patterned on a base layer; forming the resist pattern on the film to be patterned; and forming the thin-film pattern by selectively etching the film to be patterned, using the resist pattern as a mask. The resist pattern includes: an upper layer pattern made of a resist and extending over a portion corresponding to the thin-film pattern to be formed and other portions; and a lower layer pattern located between the upper layer pattern and the base layer and located only in the other portions, the lower layer pattern being made of a material being soluble in a developer used for making the upper layer pattern.

A second method of forming a thin-film pattern of the invention is provided for forming the thin-film pattern through the use of a resist pattern. The method comprises the steps of forming the resist pattern on a base layer; forming a film to be patterned on an entire surface on top of the base layer and the resist pattern; and removing the resist pattern after the film to be patterned is formed. The resist pattern includes: an upper layer pattern made of a resist and extending over a portion corresponding to the thin-film pattern to be formed and other portions; and a lower layer pattern located between the upper layer pattern and the base layer and located only in the other portions, the lower layer pattern being made of a material being soluble in a developer used for making the upper layer pattern.

A third method of forming a thin-film pattern of the invention is provided for forming the thin-film pattern through the use of a resist pattern. The method comprises the steps of forming a first film to be patterned on a base layer; forming the resist pattern on the first film; forming a first thin-film pattern by selectively etching the first film, using the resist pattern as a mask; forming a second film to be patterned on an entire surface on top of the base layer and the resist pattern; and removing the resist pattern after the second film is formed. The resist pattern includes: an upper layer pattern made of a resist and extending over a portion corresponding to the thin-film pattern to be formed and other portions; and a lower layer pattern located between the upper layer pattern and the base layer and located only in the other portions, the lower layer pattern being made of a material being soluble in a developer used for making the upper layer pattern.

A first method of manufacturing a micro device of the invention is provided for making the micro device including a thin-film pattern formed through the use of a resist pattern. The thin-film pattern is formed through the use of the resist pattern including: an upper layer pattern made of a resist and extending over a portion corresponding to the thin-film pattern to be formed and other portions; and a lower layer pattern located between the upper layer pattern and a base layer and located only in the other portions, the lower layer pattern being made of a material being soluble in a developer used for making the upper layer pattern.

According to the first method of manufacturing the micro device of the invention, the micro device may be a thin-film magnetic head.

A second resist pattern of the invention is used for forming a thin-film pattern and includes: an upper layer pattern made of a resist; a lower layer pattern located between the upper layer pattern and a base layer and made of a material being soluble in a developer used for making the upper layer pattern; and a reinforcing pattern located between the upper layer pattern and the lower layer pattern and reinforcing the upper layer pattern. The upper layer pattern and the reinforcing pattern extend over a portion corresponding to the thin-film pattern to be formed and other portions. The lower layer pattern is located only in the other portions.

A second method of forming a resist pattern of the invention is provided for forming the resist pattern to be used for forming a thin-film pattern. The resist pattern includes: an upper layer pattern made of a resist; a lower layer pattern located between the upper layer pattern and a base layer and made of a material being soluble in a developer used for making the upper layer pattern; and a reinforcing pattern located between the upper layer pattern and the lower layer pattern and reinforcing the upper layer pattern. The method comprises the steps of: forming a first layer to be the lower layer pattern on the base layer; forming a reinforcing layer to be the reinforcing pattern on the first layer; forming a second layer to be the upper layer pattern on the reinforcing layer; exposing the second layer to a specific pattern image; forming the upper layer pattern extending over a portion corresponding to the thin-film pattern to be formed and other portions by developing the second layer, which has been exposed, using the developer; forming the reinforcing pattern extending over the portion corresponding to the thin-film pattern to be formed and the other portions by selectively etching the reinforcing layer, using the upper layer pattern as a mask; and forming the lower layer pattern located only in the other portions by dissolving part of the first layer, using the developer.

A fourth method of forming a thin-film pattern of the invention is provided for forming the thin-film pattern through the use of a resist pattern. The method comprises the steps of: forming a film to be patterned on a base layer; forming the resist pattern on the film to be patterned; and forming the thin-film pattern by selectively etching the film to be patterned, using the resist pattern as a mask. The resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and reinforcing the upper layer pattern.

A fifth method of forming a thin-film pattern of the invention is provided for forming the thin-film pattern through the use of a resist pattern. The method comprises the steps of: forming the resist pattern on a base layer; forming a film to be patterned on an entire surface on top of the base layer and the resist pattern; and removing the resist pattern after the film to be patterned is formed. The resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and reinforcing the upper layer pattern.

A sixth method of forming a thin-film pattern of the invention is provided for forming the thin-film pattern through the use of a resist pattern. The method comprises the steps of forming a first film to be patterned on a base layer; forming the resist pattern on the first film; forming a first thin-film pattern by selectively etching the first film, using the resist pattern as a mask; forming a second film to be patterned on an entire surface on top of the base layer and the resist pattern; and removing the resist pattern after the second film to be patterned is formed. The resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and reinforcing the upper layer pattern.

A second method of manufacturing a micro device of the invention is provided for forming the micro device including a thin-film pattern formed through the use of a resist pattern. The thin-film pattern is formed through the use of the resist pattern including: an upper layer pattern made of a resist and extending over a portion corresponding to the thin-film pattern to be formed and other portions; a lower layer pattern located between the upper layer pattern and a base layer and located only in the other portions, the lower layer pattern being made of a material being soluble in a developer used for making the upper layer pattern; and a reinforcing pattern located between the upper layer pattern and the lower layer pattern and reinforcing the upper layer pattern.

According to the second method of manufacturing the micro device of the invention, the micro device may be a thin-film magnetic head.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

A method of forming a thin-film pattern of a first embodiment of the invention will now be described. FIG. 1 to FIG. 9 are cross sections for illustrating the steps of the method of the embodiment.

Figure 1:
FIG. 1 is a cross section for illustrating a step of a method of forming a thin-film pattern of a first embodiment of the invention.

In this method, as shown in FIG. 1, a first film 2 to be patterned is formed on a substrate 1 as a base. Next, a resist pattern of this embodiment is formed on the first film 2 through a method of forming a resist pattern of this embodiment described later. This resist pattern includes, as described later in detail, an upper layer pattern made of a resist, and a lower layer pattern made of a material being soluble in a developer used for forming the upper layer pattern. The upper layer pattern is formed to extend a portion corresponding to the thin-film pattern to be formed and other portions. The lower layer pattern is formed only in the other portions. The lower layer pattern may be made of polymethylglutarimide or polymethylglutarimide to which a dye is added.

Figure 2:
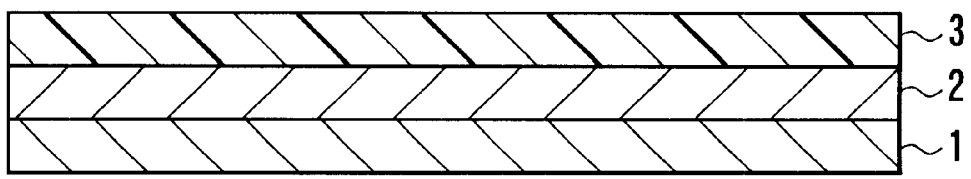
FIG. 2 is a cross section for illustrating a step that follows FIG. 1.

In the method of forming the resist pattern of this embodiment, as shown in FIG. 2, polymethylglutarimide or polymethylglutarimide with a dye is applied to the top of the first film 2 to form a first layer 3 to be the lower layer pattern.

Figure 3:
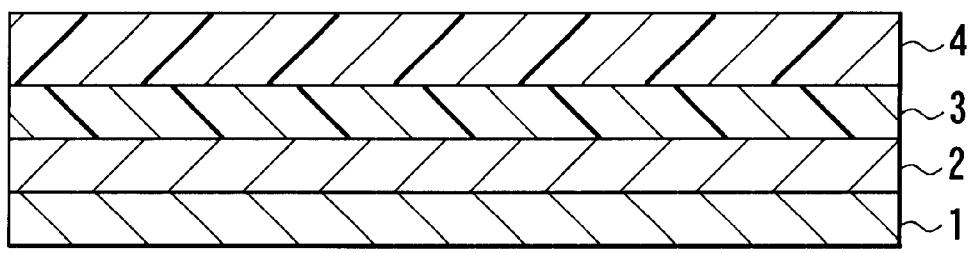
FIG. 3 is a cross section for illustrating a step that follows FIG. 2.

Next, as shown in FIG. 3, a resist is applied to the top of the first layer 3 to form a second layer 4 to be the upper layer pattern.

Figure 4:
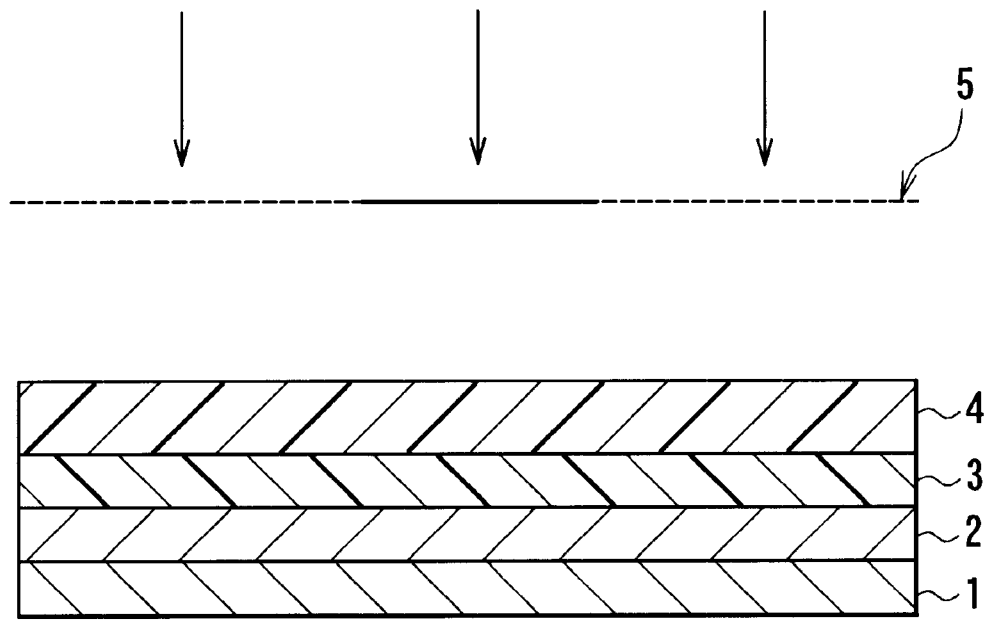
FIG. 4 is a cross section for illustrating a step that follows FIG. 3.

Next, as shown in FIG. 4, the second layer 4 is exposed through a mask 5 to a specific pattern image.

Figure 5:
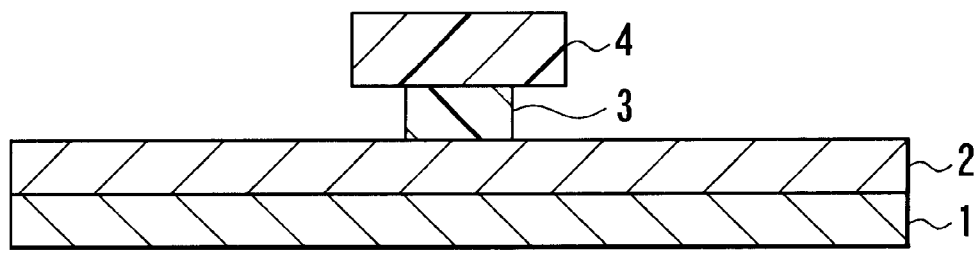
FIG. 5 is a cross section for illustrating a step that follows FIG. 4.
Figure 10:
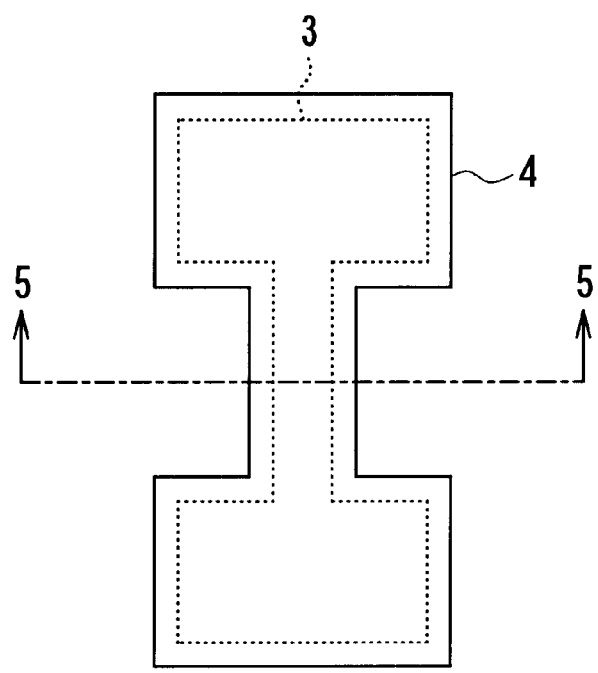
FIG. 10 is a top view for illustrating the state shown in FIG. 5.

Next, as shown in FIG. 5, the second layer 4 having undergone the exposure is developed through the use of a developer used for forming the upper layer pattern 14 such as an alkaline developer, and part of the first layer 3 is thereby dissolved. FIG. 5 illustrates the state before the final resist pattern is obtained. FIG. 10 is a top view of the state shown in FIG. 5. FIG. 5 is a cross section taken along line 5—5 of FIG. 10.

Figure 6:
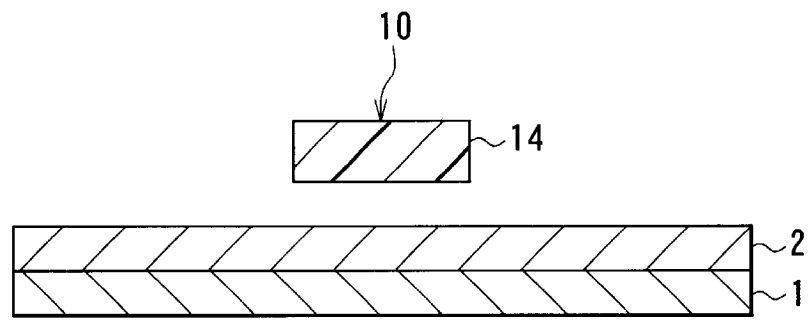
FIG. 6 is a cross section for illustrating a step that follows FIG. 5.
Figure 11:
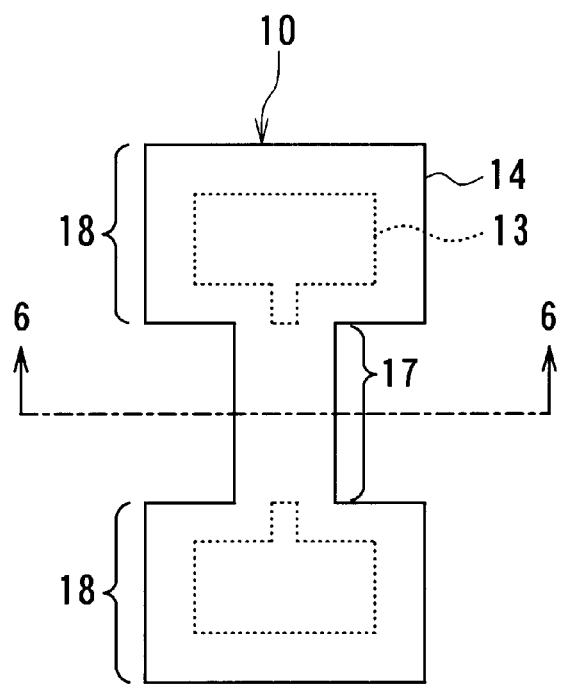
FIG. 11 is a top view for illustrating the state shown in FIG. 6.

Next, the development is further continued from the state shown in FIG. 5. The portion of the first layer 3 that corresponds to the thin-film pattern to be formed is thus completely removed, as shown in FIG. 6. A resist pattern 10 of this embodiment is thereby formed. The resist pattern 10 includes: the lower layer pattern formed through patterning the first layer 3; and the upper layer pattern 14 formed through patterning the second layer 4. FIG. 11 is a top view of the state shown in FIG. 6. FIG. 6 is a cross section taken along line 6—6 of FIG. 11. As shown in FIG. 6 and FIG. 11, the upper layer pattern 14 is formed to extend over a portion 17 corresponding to the thin-film pattern to be formed and the other portions 18. The lower layer pattern 13 is formed only in the portions 18. Therefore, the entire resist pattern 10 is bridge-shaped.

Figure 7:
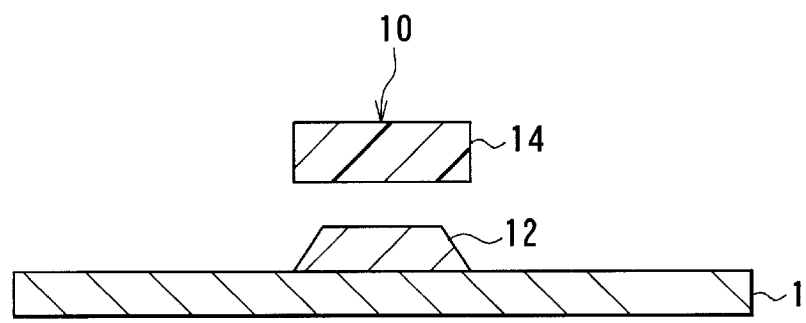
FIG. 7 is a cross section for illustrating a step that follows FIG. 6.

Next, as shown in FIG. 7, the first film 2 is selectively etched through dry etching such as ion milling or reactive ion etching, using the resist pattern 10 as a mask to obtain a first thin-film pattern 12 having a desired shape.

Figure 12:
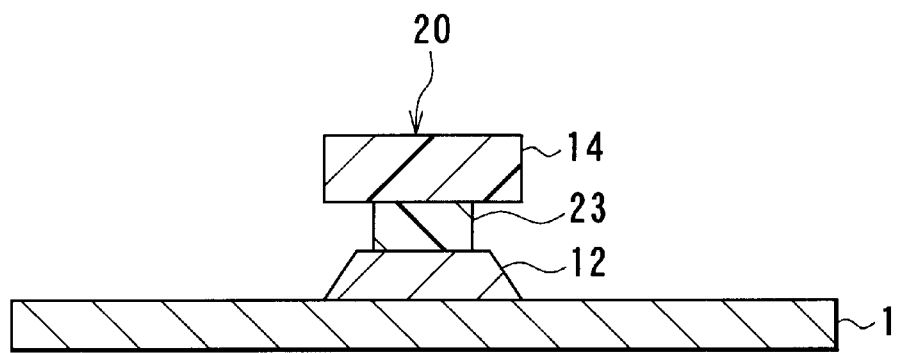
FIG. 12 is a cross section for illustrating the way in which a thin-film pattern is formed through the use of a related-art resist pattern.

FIG. 12 illustrates the way in which the first film 2 is etched to form the first thin-film pattern 12 through the use of a related-art resist pattern 20 for comparison with the embodiment of the invention. The related-art resist pattern 20 has a lower layer pattern 23 that extends over the portion corresponding to the thin-film pattern to be formed, too.

Figure 8:
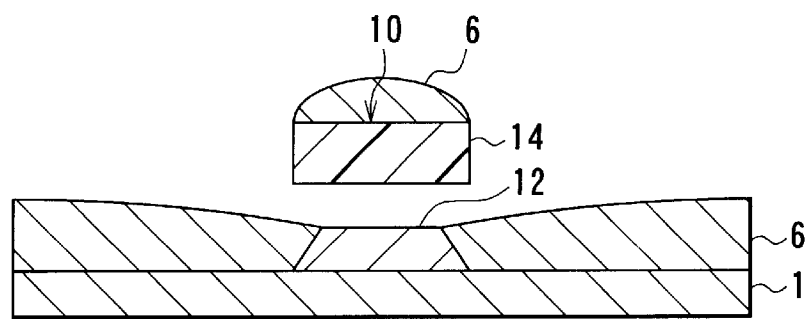
FIG. 8 is a cross section for illustrating a step that follows FIG. 7.
Figure 13:
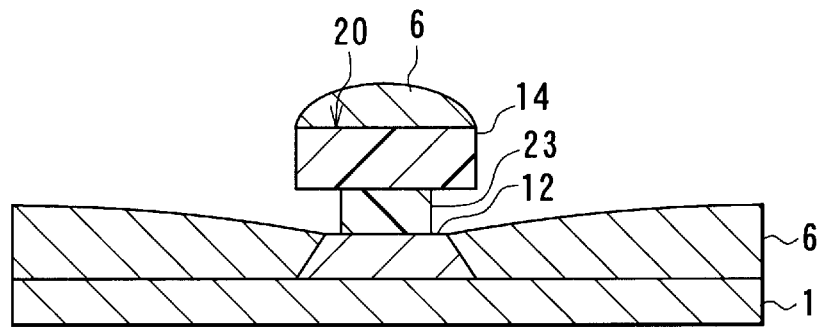
FIG. 13 is a cross section for illustrating the way in which the thin-film pattern is formed through the use of the related-art resist pattern.

Next, as shown in FIG. 8, a second film 6 to be patterned is formed over the entire surface on top of the substrate 1 and the resist pattern 10. For comparison with the embodiment of the invention, FIG. 13 illustrates the state in which the second film 6 is formed when the related-art resist pattern 20 is used.

Figure 9:
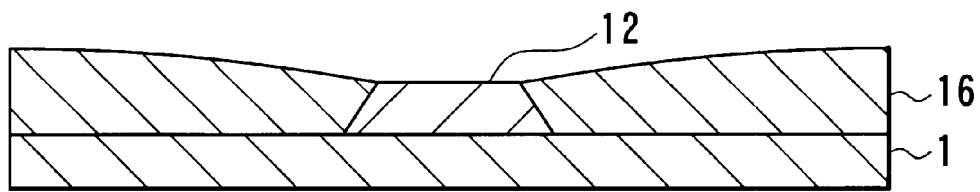
FIG. 9 is a cross section for illustrating a step that follows FIG. 8.

Next, as shown in FIG. 9, the resist pattern 10 is removed through the use of an organic solvent, for example. A second thin-film pattern 16 having a desired shape is thereby obtained.

Although the foregoing description illustrates the case in which the first thin-film pattern 12 and the second thin-film pattern 16 are formed through the combination method utilizing both etching and liftoff methods, the resist pattern and the method of forming the same of the embodiment of the invention may be applied to the case in which a thin-film pattern is formed only through the etching method or the liftoff method. To form a thin-film pattern only through the etching method, the resist pattern 10 is removed in the state shown in FIG. 7. To form a thin-film pattern only through the liftoff method, the film 2 to be patterned is not formed but the resist pattern 10 is formed on the substrate 1, and a film to be patterned is formed over the entire surface on top of the substrate 1 and the resist pattern 10. The resist pattern 10 is then removed. Therefore, the embodiment of the invention includes such a method of forming a thin-film pattern only through the etching method or the liftoff method.

Figure 14:
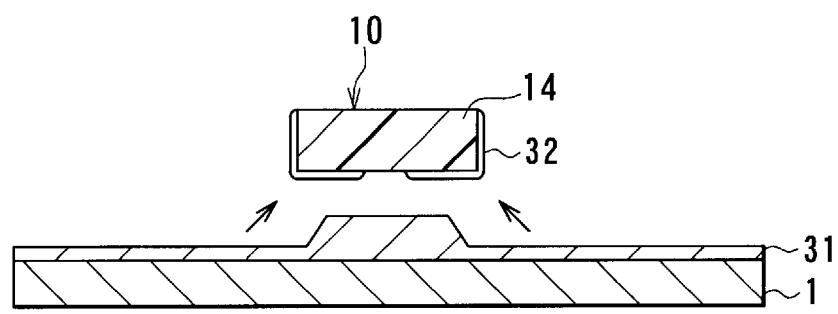
FIG. 14 is a cross section for illustrating the way in which a film to be patterned formed on the substrate is etched using the resist pattern of the first embodiment of the invention as a mask.
Figure 40:
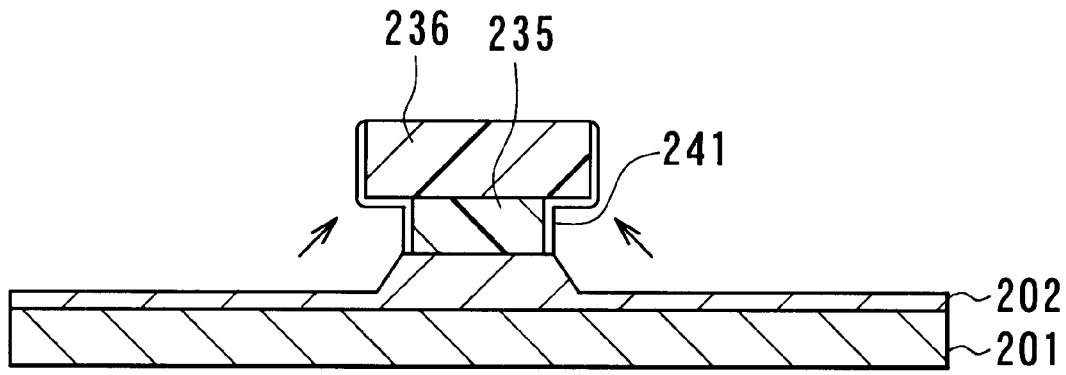
FIG. 40 is a cross section for illustrating the problem of the etching method.

The function and effect of the embodiment will now be described. Reference is made to FIG. 14 and FIG. 40 to describe the function and effect of forming a thin-film pattern through the etching method. As shown in FIG. 40, if the film 202 to be patterned formed on the substrate 201 is etched through ion milling or reactive ion etching, for example, using the resist pattern made up of the lower layer pattern 235 and the upper layer pattern 236 as a mask, the deposition film 241 is formed on the sidewalls of the patterns 235 and 236, which may cause burrs around the thin-film pattern.

FIG. 14 illustrates the way in which a film 31 to be patterned formed on the substrate 1 is etched through ion milling or reactive ion etching, for example, using the resist pattern 10 of this embodiment as a mask. In this case, no lower layer pattern exists in the portion corresponding to the thin-film pattern to be formed. Therefore, even if the substance forming the film 31 being etched deposits on the bottom or sidewalls of the upper layer pattern 14 to form the deposition film 32, it is impossible that this film 32 would be connected to the thin-film pattern. It is therefore impossible that burrs would be formed around the thin-film pattern.

Figure 15:
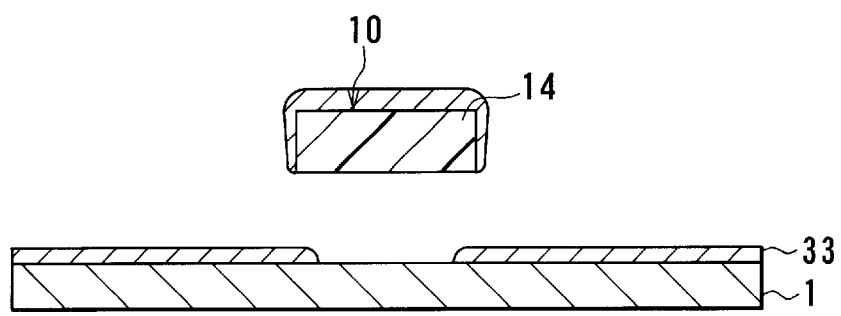
FIG. 15 is a cross section for illustrating the way in which a film to be patterned is formed on the entire surface on top of the substrate and the resist pattern of the first embodiment formed on the substrate.
Figure 41:
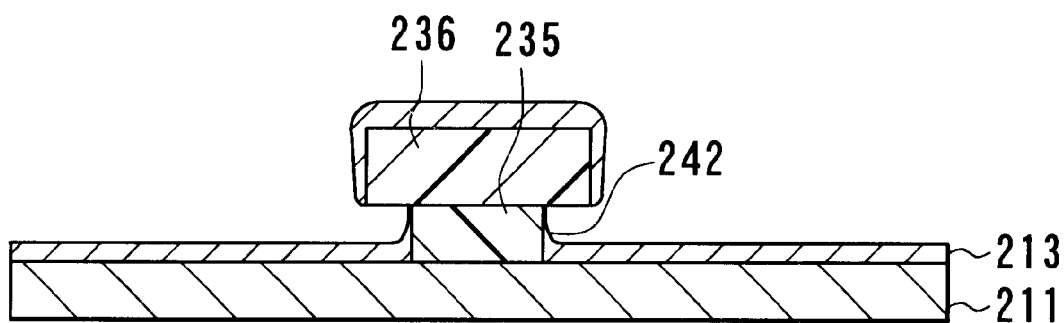
FIG. 41 is a cross section for illustrating the problem of the liftoff method.

Reference is made to FIG. 15 and FIG. 41 to describe the function and effect of forming a thin-film pattern through the liftoff method. As shown in FIG. 41, if the film 213 to be patterned is formed over the entire surface on top of the substrate 211 and the resist pattern made up of the lower layer pattern 235 and the upper layer pattern 236, the substance forming the film 213 may deposit on the sidewalls of the lower layer pattern 235, too, which may create the burrs 242 around the thin-film pattern.

FIG. 15 illustrates the way in which a film 33 to be patterned is formed on the entire surface on top of the substrate 1 and the resist pattern 10 of this embodiment formed on the substrate 1. In this case, no part of lower layer pattern exists in the portion corresponding to the thin-film pattern to be formed. Therefore, it is impossible that burrs would be formed around the thin-film pattern.

According to the embodiment, no burrs would be formed around the thin-film pattern through either the etching method or the liftoff method as described above. Therefore, it is either impossible that burrs would be formed around the thin-film pattern through the combination method.

According to the embodiment of the invention thus described, when the thin-film pattern is formed through the use of the resist pattern 10, only the upper layer pattern 14 exists in the portion corresponding to the thin-film pattern to be formed while no part of the lower layer pattern 13 exists therein. It is therefore impossible that burrs would be formed around the thin-film pattern. It is thus possible to form a fine thin-film pattern with accuracy without creating defects.

The resist pattern 10 of the embodiment includes: the upper layer pattern 14 made of a resist; and the lower layer pattern 13 made of a material being soluble in a developer used for forming the upper layer pattern 14. The upper layer pattern 14 extends over the portion corresponding to the thin-film pattern to be formed and the other portions while the lower layer pattern 13 is located only in the other portions. In addition, the resist pattern 10 is bridge-shaped. The resist pattern 10 allows control of the cross-sectional shape or length of the portion of the resist pattern 10 that corresponds to the thin-film pattern to be formed, that is, the portion located up above the film to be patterned or the base layer, and the height of this portion from the film to be patterned or the base layer, in particular, to obtain desired dimensions. It is therefore possible to form a thin-film pattern having desired geometries with precision.

According to the embodiment, the lower layer pattern 13 is made of a material being soluble in a developer used for forming the upper layer pattern 14. As a result, one step of exposing and one step of developing are only required for forming the resist pattern 10. Therefore, the number of steps required for forming the resist pattern 10 of the embodiment of the invention is smaller than the number of steps required for making each of the upper layer pattern and the lower layer pattern through individual exposing and developing steps.

Reference is now made to FIG. 16 to FIG. 19 to describe an example of a method of manufacturing a thin-film magnetic head, which is an example of a micro device, to which the resist pattern and the method of forming the same and the method of forming a thin-film pattern of the embodiment of the invention are applied. In this example a thin-film magnetic head incorporating a reproducing (read) head utilizing a giant magnetoresistive (GMR) element is described. FIG. 16 to FIG. 19 are cross sections of the pole portion each parallel to the air bearing surface (medium facing surface).

Figure 16:
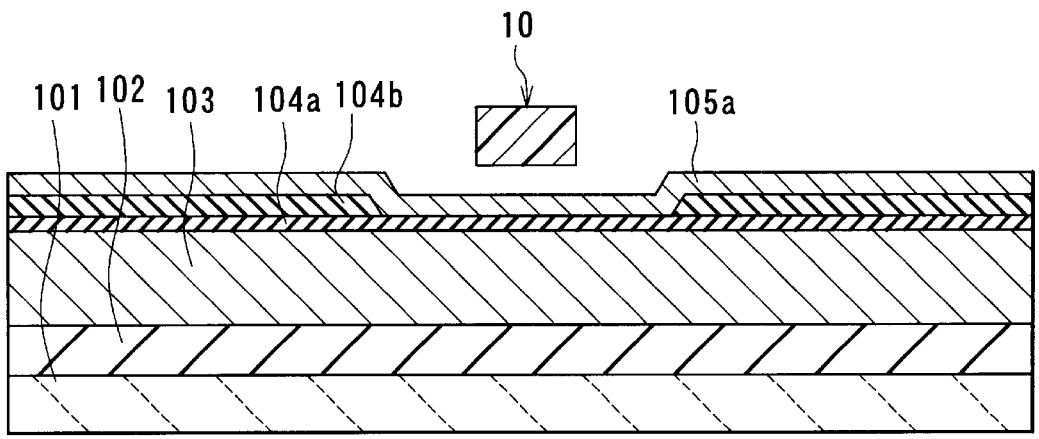
FIG. 16 is a cross section for illustrating a step of a method of manufacturing a thin-film magnetic head to which the first embodiment of the invention is applied.

In the method of manufacturing the thin-film magnetic head of this example, as shown in FIG. 16, an insulating layer 102 made of an insulating material such as alumina ($Al_2O_3$) is formed on a substrate 101 made of aluminum oxide and titanium carbide ($Al_2O_3$—TiC), for example. On the insulating layer 102 a bottom shield layer 103 made of a magnetic material is formed for making the reproducing head. Next, a first shield gap film 104a made of an insulating material such as alumina is formed on the bottom shield layer 103. Next, a second shield gap film 104b made of an insulating material such as alumina is formed on the first shield gap film 104a except a region where the GMR element described later will be formed. Next, on the second shield gap film 104b, a layer 105a to be the GMR element for reproduction is formed. Next, the resist pattern 10 of this embodiment is formed on the layer 105a in the region where the GMR element is to be formed.

Figure 17:
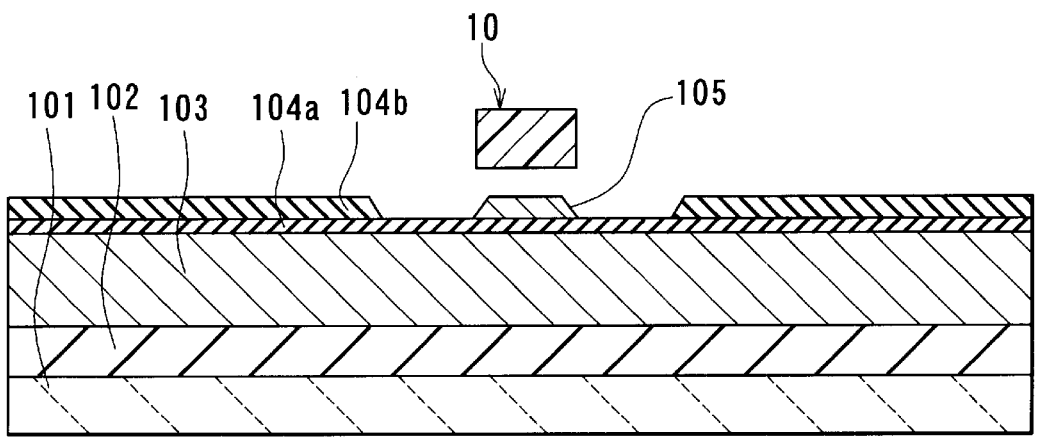
FIG. 17 is a cross section for illustrating a step that follows FIG. 16.

Next, as shown in FIG. 17, the layer 105a is selectively etched through ion milling, for example, using the resist pattern 10 as a mask to form the GMR element 105.

Figure 18:
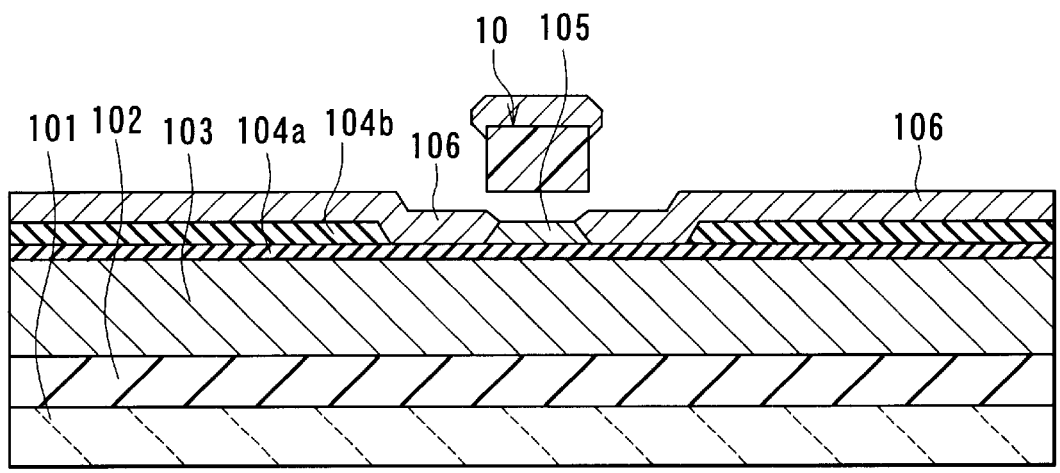
FIG. 18 is a cross section for illustrating a step that follows FIG. 17.

Next, as shown in FIG. 18, a pair of lead layers 106 are formed into specific shapes on the entire surface on top of the first shield gap film 104a, the second shield gap film 104b and the resist pattern 10. The lead layers 106 are electrically connected to the GMR element 105. The resist pattern 10 is then removed.

Figure 19:
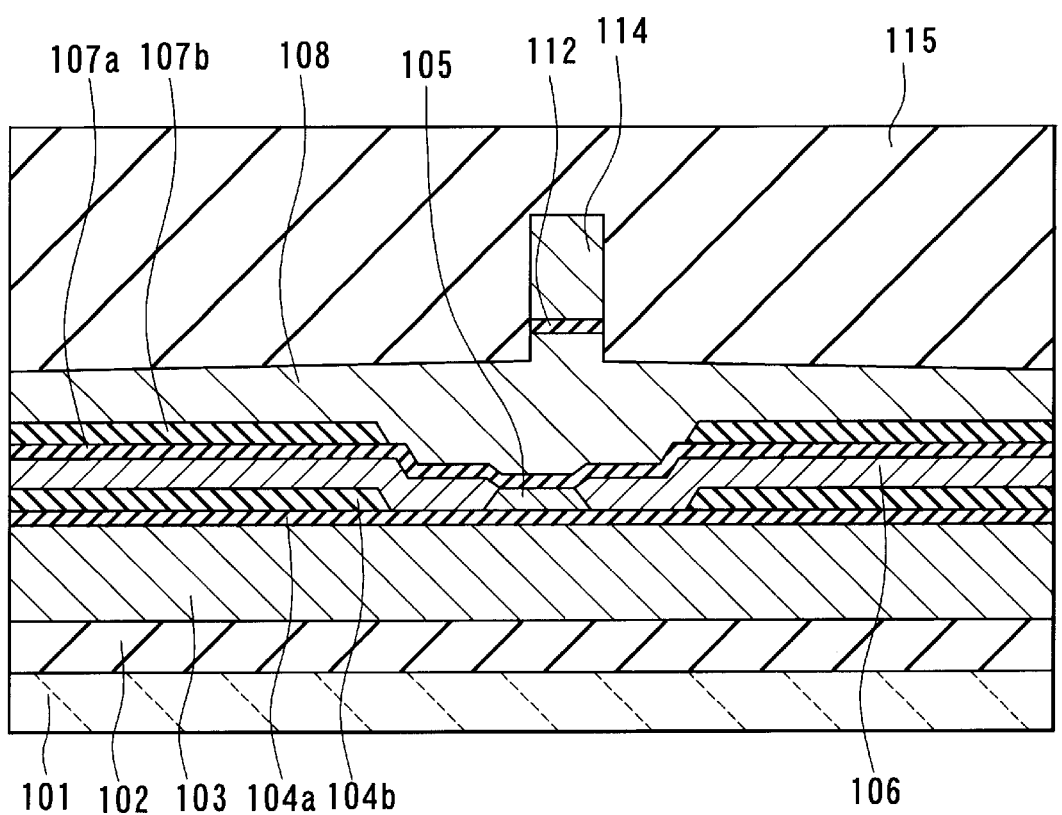
FIG. 19 is a cross section for illustrating a step that follows FIG. 18.

Next, as shown in FIG. 19, a third shield gap film 107a made of an insulating material such as alumina is formed on the shield gap films 104a and 104b, the GMR element 105 and the lead layers 106. The GMR element 105 is embedded in the shield gap films 104a and 107a. Next, a fourth shield gap film 107b made of an insulating material such as alumina is formed on the third shield gap film 107a except the neighborhood of the GMR element 105.

Next, on the shield gap films 107a and 107b, a top-shield-layer-cum-bottom-pole-layer (called a top shield layer in the following description) 108 is formed. The top shield layer 108 is made of a magnetic material and used for both reproducing head and recording head. Next, a recording gap layer 112 made of an insulating film such as an alumina film is formed on the top shield layer 108. Next, although not shown, a portion of the recording gap layer 112 located in the center portion of a region where a thin-film coil described later is to be formed is selectively etched to form a contact hole.

Next, although not shown, a first photoresist layer that defines the throat height is formed into a specific shape on the gap layer 112. The throat height is the length (height) of the pole portions, that is, the portions of the two magnetic layers of the recording head facing toward each other with the recording gap layer in between, the length between the air-bearing-surface-side end and the other end.

Next, the thin-film coil of the recording (write) head is formed on the first photoresist layer. Next, a second photoresist layer for insulating the coil is formed into a specific shape to cover the first photoresist layer and the coil.

Next, a top pole layer 114 made of a magnetic material such as Permalloy (NiFe) is formed for the recording head on the gap layer 112 and the first and second photoresist layers. The top pole layer 114 is in contact with and magnetically coupled to the top shield layer (bottom pole layer) 108 through the contact hole formed in the center portion of the region where the thin-film coil is formed.

Next, the recording gap layer 112 and part of the top shield layer (bottom pole layer) 108 are etched through ion milling, for example, using the pole portion of the top pole layer 114 as a mask. A trim structure is thus formed wherein the sidewalls of the top pole layer 114, the gap layer 112 and part of the top shield layer 108 are vertically formed in a self-aligned manner. The trim structure suppresses an increase in the effective track width due to expansion of a magnetic flux generated during writing in a narrow track.

Next, an overcoat layer 115 made of alumina, for example, is formed over the top pole layer 114. Finally, lapping of the slider including the foregoing layers is performed to form the air bearing surface of the thin-film magnetic head including the recording head and the reproducing head. The thin-film magnetic head is thus completed.

For such a thin-film magnetic head, it is required to precisely control the width of the portion that defines the track width of the GMR element 105, and the amounts of overhanging of the lead layers 106 that hang over the GMR element 105. According to the resist pattern and the method of forming the same and the method of forming the thin-film pattern of the embodiment as described above, it is possible to form a thin-film pattern of a desired shape with precision. It is thus possible to precisely control the width of the portion that defines the track width of the GMR element 105, and the amounts of overhanging of the lead layers 106 that hang over the GMR element 105 if the GMR element 105 and the lead layers 106 are formed through the embodiment of the invention.

[Second Embodiment]

A method of forming a thin-film pattern of a second embodiment of the invention will now be described. FIG. 20 to FIG. 28 are cross sections for illustrating the steps of the method of this embodiment.

The method of the second embodiment includes the steps similar to the steps of the method of the first embodiment performed to form the first film 2 to be patterned on the substrate 1 and to form the first layer 3 to be the lower layer pattern of the resist pattern by applying polymethylglutarimide or polymethylglutarimide with a dye to the top of the first film 2.

Figure 20:
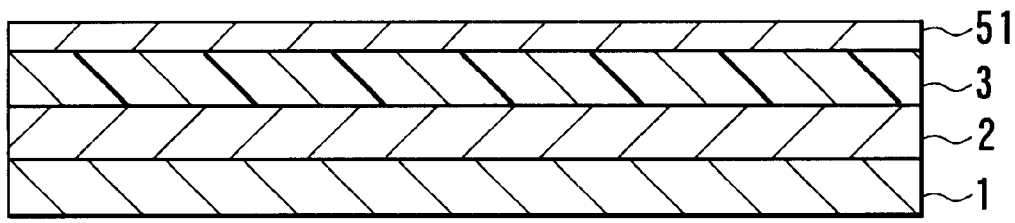
FIG. 20 is a cross section for illustrating a step of a method of forming a thin-film pattern of a second embodiment of the invention.

In the following step of the method of the second embodiment, as shown in FIG. 20, a reinforcing layer 51 having heat resistance is formed on the first layer 3. The reinforcing layer 51 may be made of at least one of a metal film and a ceramic film. Such a ceramic film may be a metal oxide film or a metal nitride film.

Figure 21:
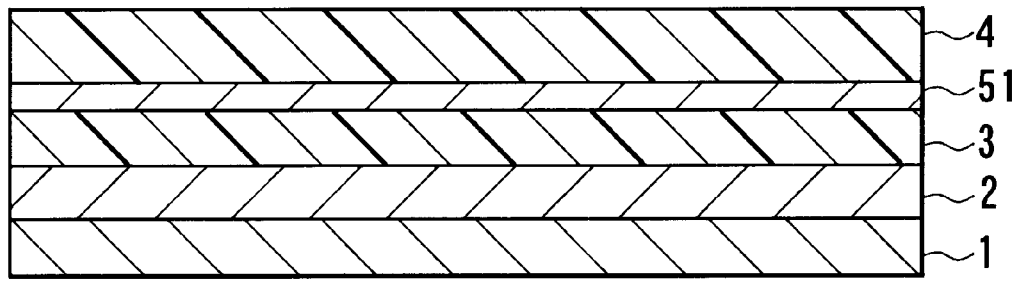
FIG. 21 is a cross section for illustrating a step that follows FIG. 20.

Next, as shown in FIG. 21, a resist is applied to the top of the reinforcing layer 51 to form the second layer 4 to be the upper layer pattern of the resist pattern.

Figure 22:
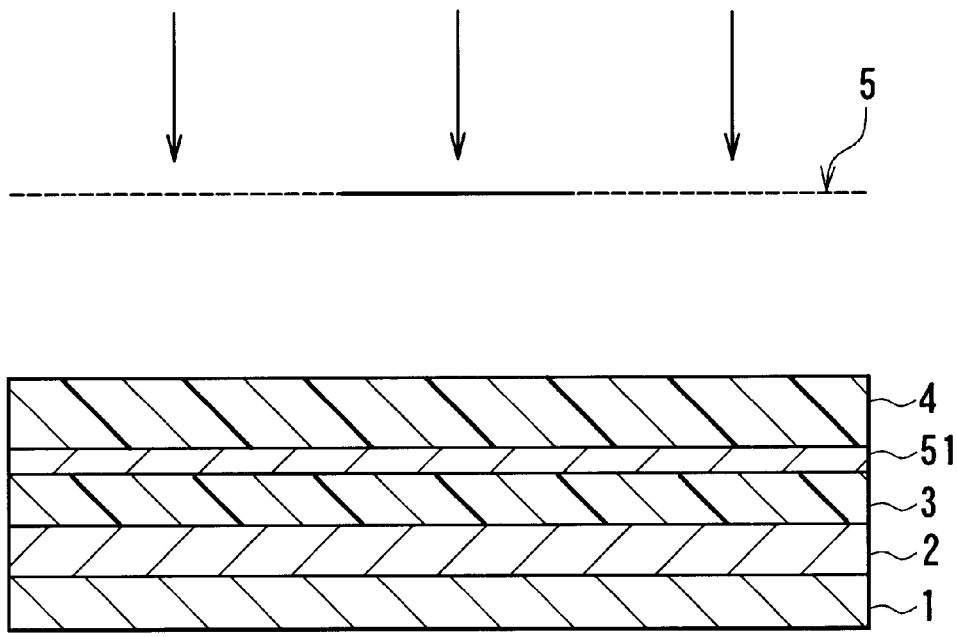
FIG. 22 is a cross section for illustrating a step that follows FIG. 21.

Next, as shown in FIG. 22, the second layer 4 is exposed through the mask 5 to a specific pattern image.

Figure 23:
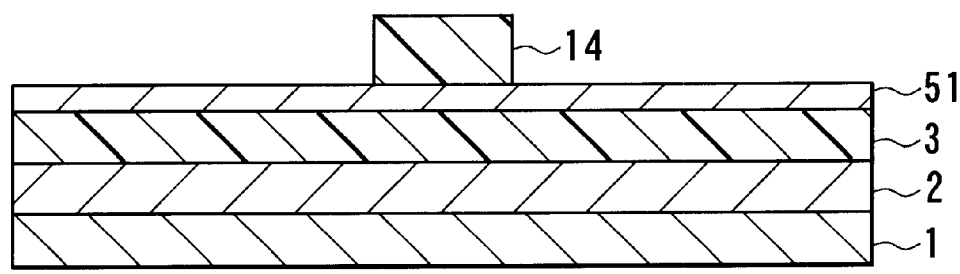
FIG. 23 is a cross section for illustrating a step that follows FIG. 22.

Next, as shown in FIG. 23, the second layer 4 having undergone the exposure is developed through the use of a developer used for forming the upper layer pattern 14 such as an alkaline developer to form the upper layer pattern 14. The first layer 3 will not be thereby dissolved since the first layer 3 is covered with the reinforcing layer 51.

Figure 24:
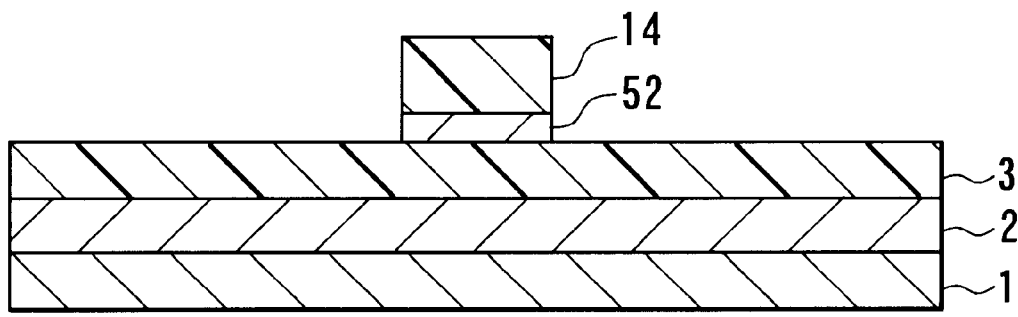
FIG. 24 is a cross section for illustrating a step that follows FIG. 23.

Next, as shown in FIG. 24, the reinforcing layer 51 is selectively etched through wet etching or dry etching such as ion milling or reactive ion etching, using the upper layer pattern 14 as a mask. A reinforcing pattern 52 whose top surface has a shape similar to that of the upper layer pattern 14 is thus formed.

Figure 25:
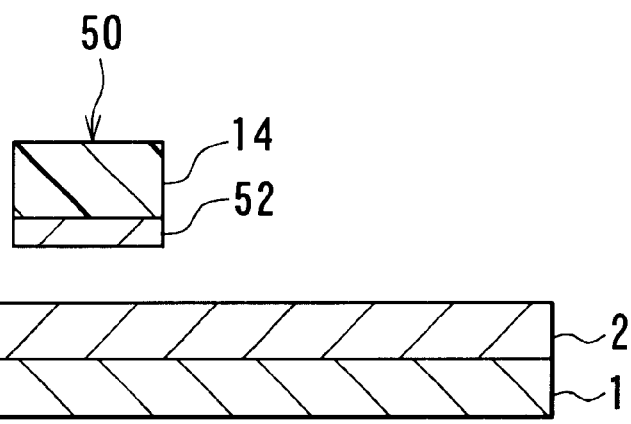
FIG. 25 is a cross section for illustrating a step that follows FIG. 24.

Next, as shown in FIG. 25, part of the first layer 3 is dissolved through the use of the above-mentioned developer such as an alkaline developer. The portion of the first layer 3 that corresponds to the thin-film pattern to be formed is thus completely removed. A resist pattern 50 of this embodiment is thereby formed. The resist pattern 50 includes: the lower layer pattern formed through patterning the first layer 3; the reinforcing pattern 52 formed through patterning the reinforcing layer 51; and the upper layer pattern 14 formed through patterning the second layer 4.

Figure 29:
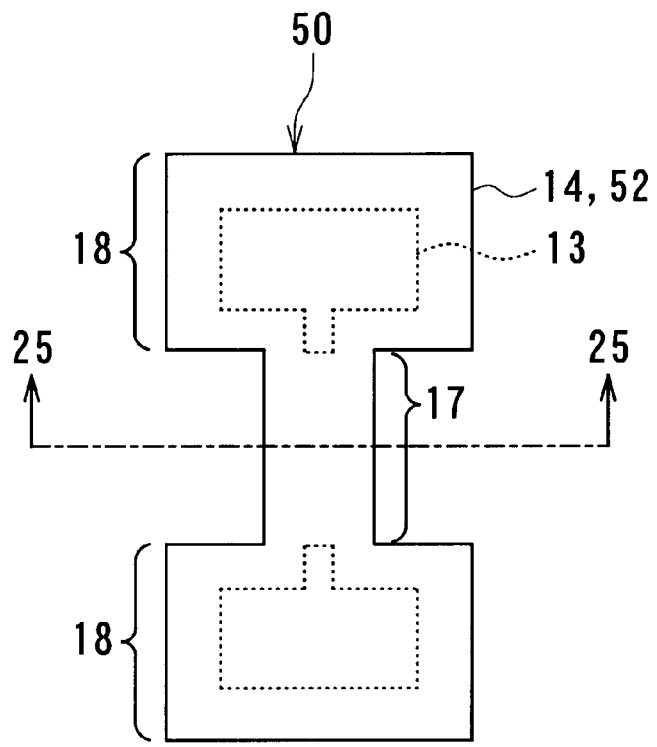
FIG. 29 is a top view for illustrating the state shown in FIG. 25.

FIG. 29 is a top view of the state shown in FIG. 25. FIG. 25 is a cross section taken along line 25—25 of FIG. 29. As shown in FIG. 25 and FIG. 29, the upper layer pattern 14 and the reinforcing pattern 52 are formed to extend over the portion 17 corresponding to the thin-film pattern to be formed and the other portions 18. The lower layer patterns 13 are formed only in the portions 18. Therefore, the entire resist pattern 50 is bridge-shaped.

Figure 26:
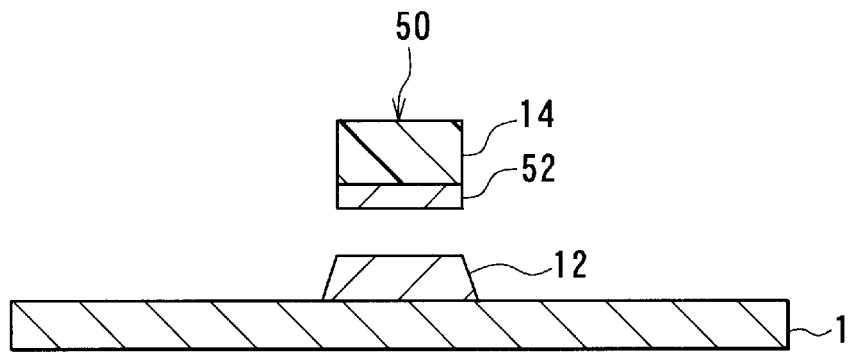
FIG. 26 is a cross section for illustrating a step that follows FIG. 25.

Next, as shown in FIG. 26, the first film 2 is selectively etched through dry etching such as ion milling or reactive ion etching, using the resist pattern 50 as a mask to obtain the first thin-film pattern 12 having a desired shape.

Figure 27:
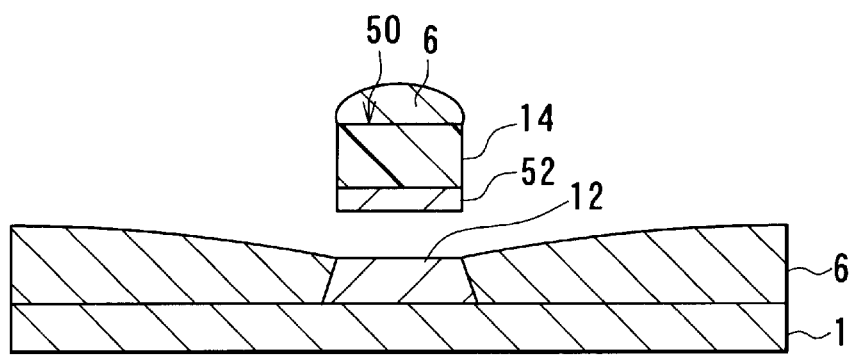
FIG. 27 is a cross section for illustrating a step that follows FIG. 26.

Next, as shown in FIG. 27, the second film 6 to be patterned is formed over the entire surface on top of the substrate 1 and the resist pattern 50.

Figure 28:
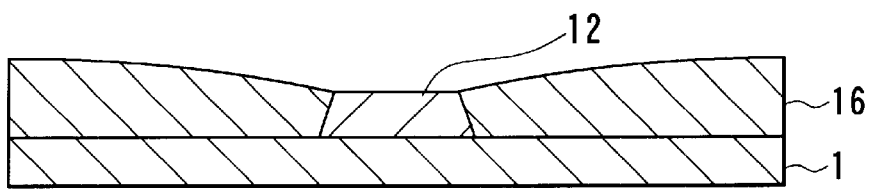
FIG. 28 is a cross section for illustrating a step that follows FIG. 27.

Next, as shown in FIG. 28, the resist pattern 50 is removed through the use of an organic solvent, for example. The second thin-film pattern 16 having a desired shape is thereby obtained.

Although the foregoing description illustrates the case in which the first thin-film pattern 12 and the second thin-film pattern 16 are formed through the combination method utilizing both etching and liftoff methods, the resist pattern and the method of forming the same of the embodiment of the invention may be applied to the case in which a thin-film pattern is formed only through the etching method or the liftoff method. To form a thin-film pattern only through the etching method, the resist pattern 50 is removed in the state shown in FIG. 26. To form a thin-film pattern only through the liftoff method, the film 2 to be patterned is not formed but the resist pattern 50 is formed on the substrate 1, and a film to be patterned is formed over the entire surface on top of the substrate 1 and the resist pattern 50. The resist pattern 50 is then removed. Therefore, the embodiment of the invention includes such a method of forming a thin-film pattern only through the etching method or the liftoff method.

Figure 30:
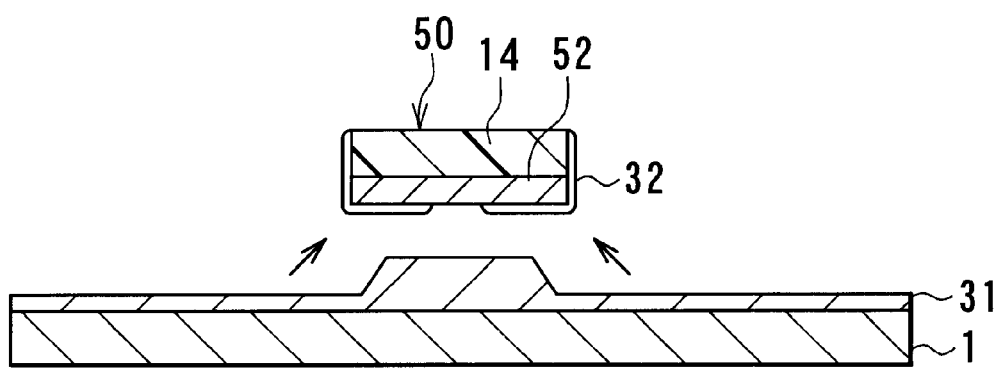
FIG. 30 is a cross section for illustrating the way in which a film to be patterned formed on the substrate is etched using the resist pattern of the second embodiment as a mask.

The function and effect of the embodiment will now be described. Reference is made to FIG. 30 to describe the function and effect of forming a thin-film pattern through the etching method. FIG. 30 illustrates the way in which the film 31 to be patterned is etched through ion milling or reactive ion etching, for example, with the resist pattern 50 of this embodiment as a mask. In this case, no part of lower layer pattern exists in the portion corresponding to the thin-film pattern to be formed. Therefore, even if the substance forming the film 31 being etched deposits on the bottom or sidewalls of the upper layer pattern 14 to form the deposition film 32, it is impossible that this film 32 would be connected to the thin-film pattern. It is therefore impossible that burrs would be formed around the thin-film pattern.

Figure 31:
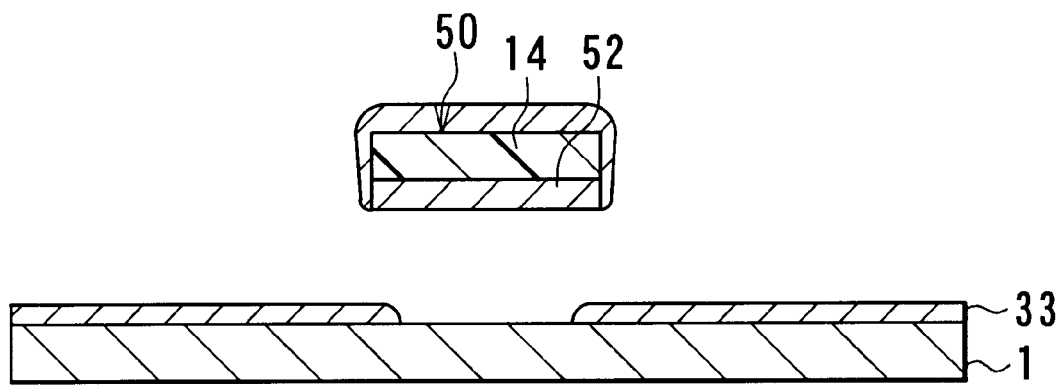
FIG. 31 is a cross section for illustrating the way in which a film to be patterned is formed on the entire surface on top of the substrate and the resist pattern of the second embodiment formed on the substrate.

Reference is made to FIG. 31 to describe the function and effect of forming a thin-film pattern through the liftoff method. FIG. 31 illustrates the way in which the film 33 to be patterned is formed on the entire surface on top of the substrate 1 and the resist pattern 50 of this embodiment formed on the substrate 1. In this case, no part of lower layer pattern exists in the portion corresponding to the thin-film pattern to be formed. Therefore, it is impossible that burrs would be formed around the thin-film pattern.

According to the embodiment, no burrs would be formed around the thin-film pattern through either the etching method or the liftoff method as described above. Therefore, it is either impossible that burrs would be formed around the thin-film pattern through the combination method.

According to the embodiment of the invention thus described, when the thin-film pattern is formed through the use of the resist pattern 50, only the upper layer pattern 14 exists in the portion corresponding to the thin-film pattern to be formed while no part of the lower layer pattern 13 exists therein. It is therefore impossible that burrs would be formed around the thin-film pattern. It is thus possible to form a fine thin-film pattern with accuracy without creating defects.

Figure 32:
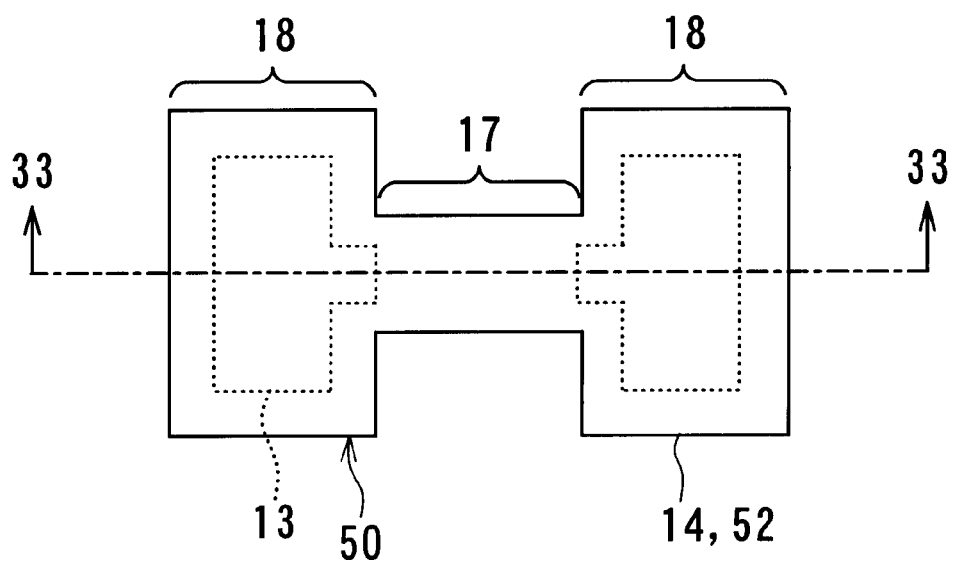
FIG. 32 is a top view of the resist pattern of the second embodiment.
Figure 33:
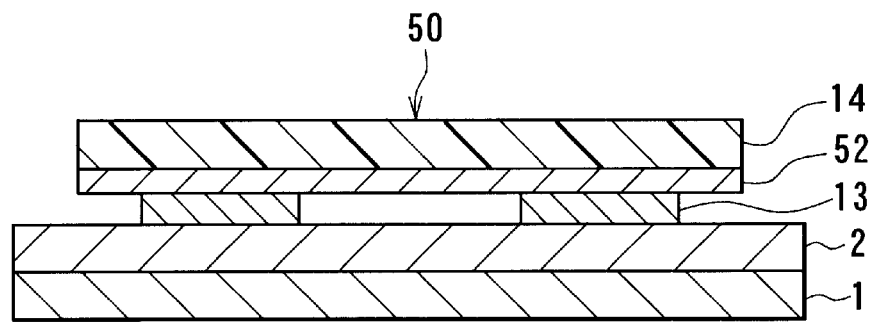
FIG. 33 is a cross section taken along line 33—33 of FIG. 32.

Reference is now made to FIG. 32 to FIG. 35 to describe the function and effect of the reinforcing pattern 52. FIG. 32 is a top view of the resist pattern 50 of this embodiment. FIG. 33 is a cross section taken along line 33—33 of FIG. 32.

Figure 34:
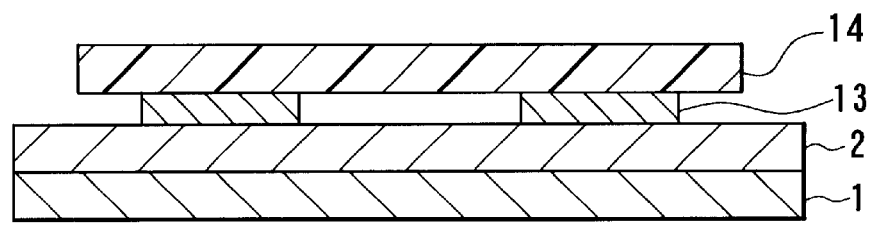
FIG. 34 is a cross section of a resist pattern similar to the resist pattern of the second embodiment except that this resist pattern includes no reinforcing pattern.
Figure 35:
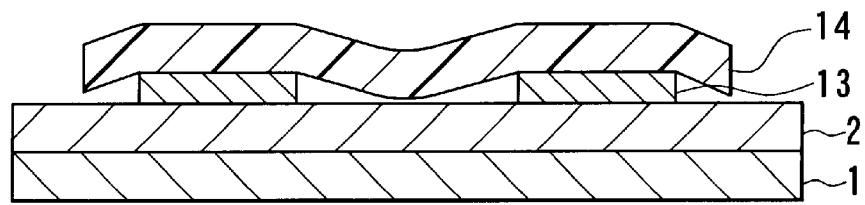
FIG. 35 is a cross section for illustrating the resist pattern shown in FIG. 34 in which the upper layer pattern is loose.
Figure 36A:
FIG. 36A to FIG. 36D illustrate the etching method.
Figure 36B:
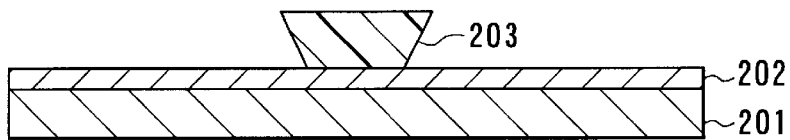
Figure 36C:
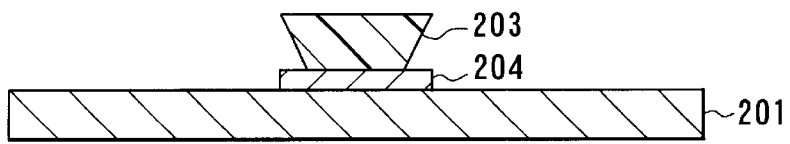
Figure 36D:
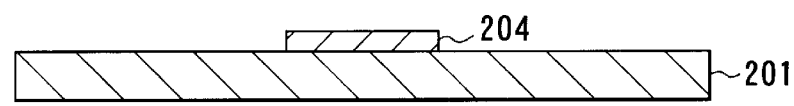
Figure 37A:
FIG. 37A to FIG. 37C illustrate the liftoff method.
Figure 37B:
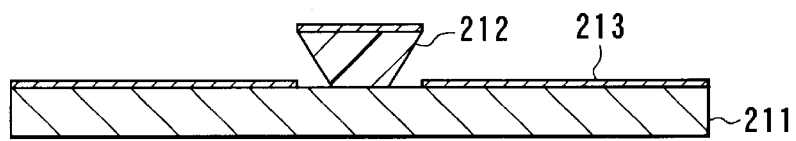
Figure 37C:
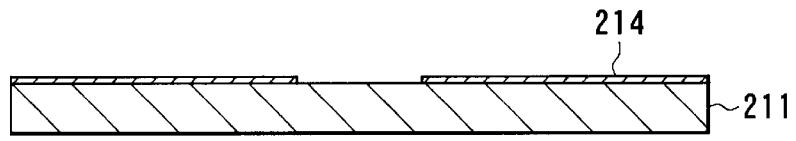
Figure 38A:
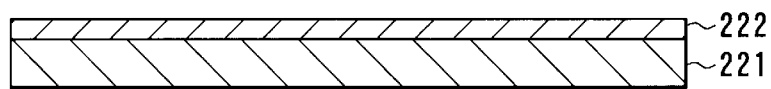
FIG. 38A to FIG. 38E illustrate the combination method.
Figure 38B:
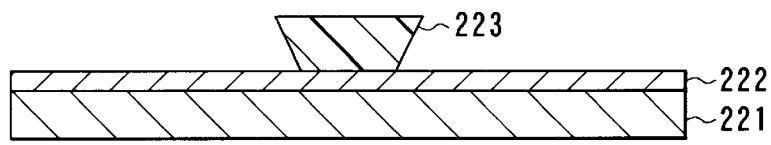
Figure 38C:
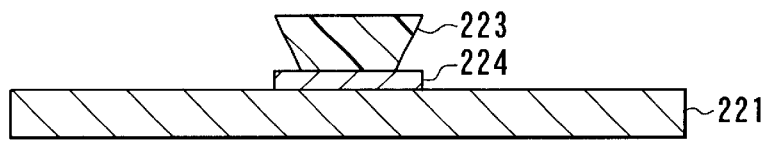
Figure 38D:
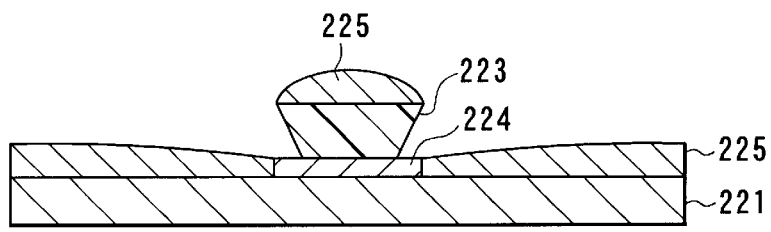
Figure 38E:
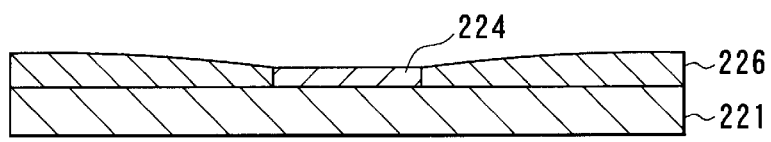
Figure 39A:
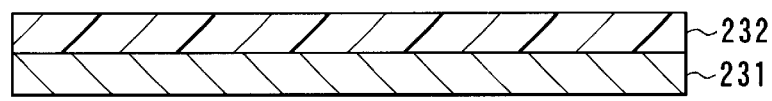
FIG. 39A to FIG. 39D illustrate the method of forming the resist pattern having a T-shaped cross section through the use of the two-layer resist.
Figure 39B:
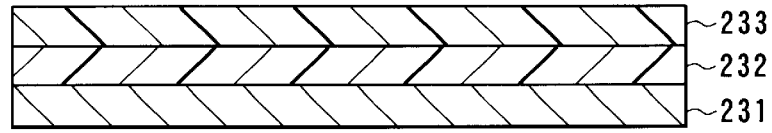
Figure 39C:
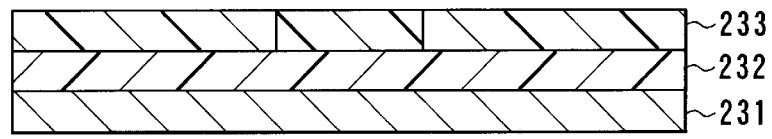
Figure 39D:
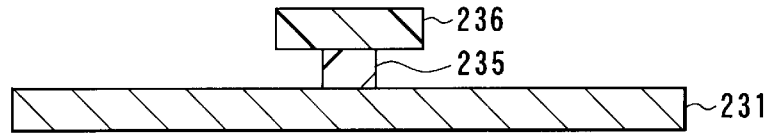

FIG. 34 is a cross section of a resist pattern similar to the resist pattern 50 of the embodiment except that this resist pattern includes no reinforcing pattern 52, for comparison with the embodiment. If the film 2 to be patterned is etched through ion milling or reactive ion etching, for example, using the resist pattern without the reinforcing pattern 52 as a mask, or if the film to be patterned is formed through the use of the resist pattern without the reinforcing pattern 52, the upper layer pattern 14 made of a resist may become loose, as shown in FIG. 35, due to the heat applied to the resist pattern. As a result, it is impossible to maintain an appropriate distance between the upper layer pattern 14 and the film to be patterned or the base layer in the portion corresponding to the thin-film pattern to be formed. It is therefore impossible to perform desired patterning in some cases.

According to the resist pattern 50 of the embodiment, in contrast, the heat-resistant reinforcing pattern 52 exists below the upper layer pattern 14, as shown in FIG. 33. The shape of the upper layer pattern 14 is thereby maintained when the first film 2 to be patterned is etched through ion milling or reactive ion etching, for example, using the resist pattern 50 as a mask, or when the film to be patterned is formed through the use of the resist pattern 50. It is thus possible to form a thin-film pattern of a desired shape with precision.

In place of the resist pattern 10 of the first embodiment, the resist pattern 50 of the second embodiment may be applied to a method of manufacturing a thin-film magnetic head as shown in FIG. 16 to FIG. 19. In such a case, it is possible to precisely control the width of the portion that defines the track width of the GMR element 105, and the amounts of overhanging of the lead layers 106 that hang over the GMR element 105.

The remainder of configuration, functions and effects of the second embodiment are similar to those of the first embodiment.

The present invention is not limited to the foregoing embodiment but may be practiced in still other ways. For example, the invention may be applied to any micro device other than a thin-film magnetic head.

According to the first resist pattern or method of forming the same of the invention, the first to third methods of forming a thin-film pattern of the invention, or the first method of manufacturing a micro device of the invention described so far, the thin-film pattern is formed through the use of the resist pattern wherein the upper layer pattern only exists in the portion corresponding to the thin-film pattern to be formed while no part of the lower layer pattern exists therein. As a result, a fine thin-film pattern is formed with precision without creating defects.

According to the second resist pattern or method of forming the same of the invention, the fourth to sixth methods of forming a thin-film pattern of the invention, or the second method of manufacturing a micro device of the invention, the thin-film pattern is formed through the use of the resist pattern wherein the upper layer pattern and the reinforcing pattern only exist in the portion corresponding to the thin-film pattern to be formed while no part of the lower layer pattern exists therein. As a result, a fine thin-film pattern is formed with precision without creating defects.

Obviously many modifications and variations of the present invention are possible in the light of the above teachings. It is therefore to be understood that within the scope of the appended claims the invention may be practiced otherwise than as specifically described.

What is claimed is:

1. A resist pattern used for forming a thin-film pattern, the resist pattern including: an upper layer pattern made of a resist; a lower layer pattern located between the upper layer pattern and a base layer and made of a material being soluble in a developer used for making the upper layer pattern; and a reinforcing pattern located between the upper layer pattern and the lower layer pattern and supporting the upper layer pattern from beneath to reinforce the upper layer pattern; wherein:

the upper layer pattern and the reinforcing pattern extend over a portion corresponding to the thin-film pattern to be formed and other portions; and the lower layer pattern is located only in the other portions.

2. A method of forming a resist pattern to be used for forming a thin-film pattern, the resist pattern including: an upper layer pattern made of a resist; a lower layer pattern located between the upper layer pattern and a base layer and made of a material being soluble in a developer used for making the upper layer pattern; and a reinforcing pattern located between the upper layer pattern and the lower layer pattern and supporting the upper layer pattern from beneath to reinforce the upper layer pattern; the method comprising the steps of:

forming a first layer to be the lower layer pattern on the base layer;

forming a reinforcing layer to be the reinforcing pattern on the first layer;

forming a second layer to be the upper layer pattern on the reinforcing layer;

exposing the second layer to a specific pattern image;

forming the upper layer pattern extending over a portion corresponding to the thin-film pattern to be formed and other portions by developing the second layer, which has been exposed, using the developer;

forming the reinforcing pattern extending over the portion corresponding to the thin-film pattern to be formed and the other portions by selectively etching the reinforcing layer, using the upper layer pattern as a mask; and forming the lower layer pattern located only in the other portions by dissolving part of the first layer, using the developer.

3. A method of forming a thin-film pattern through the use of a resist pattern, the method comprising the steps of:

forming a film to be patterned on a base layer;

forming the resist pattern on the film to be patterned; and forming the thin-film pattern by selectively etching the film to be patterned, using the resist pattern as a mask; wherein the resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and supporting the upper layer pattern from beneath to reinforce the upper layer pattern.

4. A method of forming a thin-film pattern through the use of a resist pattern, the method comprising the steps of:

forming the resist pattern on a base layer;

forming a film to be patterned on an entire surface on top of the base layer and the resist pattern; and removing the resist pattern after the film to be patterned is formed; wherein the resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and supporting the upper layer pattern from beneath to reinforce the upper layer pattern.

5. A method of forming a thin-film pattern through the use of a resist pattern, the method comprising the steps of:

forming a first film to be patterned on a base layer;

forming the resist pattern on the first film;

forming a first thin-film pattern by selectively etching the first film, using the resist pattern as a mask;

forming a second film to be patterned on an entire surface on top of the base layer and the resist pattern; and removing the resist pattern after the second film to be patterned is formed; wherein the resist pattern includes: an upper layer pattern made of a resist and extending over a portion corresponding to the thin-film pattern to be formed and other portions; a lower layer pattern located between the upper layer pattern and the base layer and located only in the other portions, the lower layer pattern being made of a material being soluble in a developer used for making the upper layer pattern; and a reinforcing pattern located between the upper layer pattern and the lower layer pattern and supporting the upper layer pattern from beneath to reinforce the upper layer pattern.

6. A method of manufacturing a micro device including a thin-film pattern formed through the use of a resist pattern, wherein the thin-film pattern is formed through the use of the resist pattern including: an upper layer pattern made of a resist and extending over a portion corresponding to the thin-film pattern to be formed and other portions; a lower layer pattern located between the upper layer pattern and a base layer and located only in the other portions, the lower layer pattern being made of a material being soluble in a developer used for making the upper layer pattern; and a reinforcing pattern located between the upper layer pattern and the lower layer pattern and supporting the upper layer pattern from beneath to reinforce the upper layer pattern.

7. The method according to claim 6 wherein the micro device is a thin-film magnetic head.

* * * * *